US012690313B2

(12) United States Patent (10) Patent No.: US 12,690,313 B2

Zhu et al. (45) Date of Patent: Jul. 21, 2026

(54) LIGHT-EMITTING DIODE

(71) Applicant: Xiamen San'an Optoelectronics Co., Ltd., Xiamen (CN)

(72) Inventors: Xiushan Zhu, Xiamen (CN); Yan Li, Xiamen (CN)

(73) Assignee: Xiamen San'an Optoelectronics Co., Ltd., Xiamen (CN)

( * ) Notice: Subject to any disclaimer, the term of this patent is extended or adjusted under 35 U.S.C. 154(b) by 820 days.

(21) Appl. No.: 17/835,368

(22) Filed: Jun. 8, 2022

(65) Prior Publication Data

US 2023/0024651 A1 Jan. 26, 2023

(30) Foreign Application Priority Data

Jul. 22, 2021 (CN) .......................... 202110839925.5

(51) Int. Cl.
| | |
|---|---|
| H10H 20/832 | (2025.01) |
| H10H 20/815 | (2025.01) |
| H10H 20/856 | (2025.01) |
| H10H 20/857 | (2025.01) |
| H10H 29/80 | (2025.01) |

(52) U.S. Cl.
CPC ........ H10H 20/857 (2025.01); H10H 20/815 (2025.01); H10H 20/832 (2025.01); H10H 20/835 (2025.01); H10H 20/856 (2025.01); H10H 29/8322 (2025.01); H10H 29/8325 (2025.01)

(58) Field of Classification Search
CPC .. H01L 33/387; H10H 20/032; H10H 20/832; H10H 20/835; H10H 29/8322; H10H 29/8325; H10H 29/032
See application file for complete search history.

(56) References Cited

U.S. PATENT DOCUMENTS

| | | | | |
|---|---|---|---|---|
| 2008/0093612 | A1* | 4/2008 | Konno et al. .......... | H10H 20/82 |
| 2010/0203661 | A1* | 8/2010 | Hodota ................ | H10H 20/018 |
| 2016/0005941 | A1* | 1/2016 | Tsai ...................... | H01L 33/387 |
| | | | | 257/98 |
| 2019/0267529 | A1* | 8/2019 | Nakai ...................... | H01L 33/38 |
| 2019/0371969 | A1* | 12/2019 | Kopp ...................... | H01L 33/40 |
| 2023/0048544 | A1* | 2/2023 | Choi et al. ......... | H10H 20/8312 |

FOREIGN PATENT DOCUMENTS

| | | |
|---|---|---|
| CN | 106159057 A | 11/2016 |
| CN | 107516704 A | 12/2017 |

* cited by examiner

*Primary Examiner* — Matthew C Landau

(74) *Attorney, Agent, or Firm* — Hemisphere Law, PLLC

(57) ABSTRACT

A light-emitting diode includes a light-emitting structure, a first insulating layer and a first electrode layer. The first electrode layer is formed on the first insulating layer and in the first opening, and is electrically connected to the first semiconductor layer through the first opening. The first electrode layer includes a first metal reflective layer and a stress adjustment layer. The first metal reflective layer in the first opening is in contact with the first semiconductor layer, and located between the first semiconductor layer and the stress adjustment layer. The first metal reflective layer and the stress adjustment layer contain a same metal element, and a content of the same metal element in the first metal reflective layer is greater than that in the stress adjustment layer.

16 Claims, 7 Drawing Sheets

LIGHT-EMITTING DIODE

TECHNICAL FIELD

The disclosure relates to the field of semiconductor technologies, and more particularly to a light-emitting diode and a fabrication method thereof.

BACKGROUND

Light emitting diodes (LEDs) are a kind of semiconductor device, which emit light by releasing energy during recombination of carriers. Especially, flip-chip LEDs have advantages of wire-boding free, high luminous efficiency and good heat dissipation, and therefore are used more and more widely.

At present, some of flip-chip LED chips are mainly used in vehicles, backlights, high-power lightings and other fields. Due to requirements of large driving current, high heat dissipation and low chip internal resistance, most of these LED chips use metal reflective layers (such as silver and aluminum) as main mirror materials to achieve better reflection of lights emitted from the LED chips. However, the metal reflective layer of such type of chip does not cover the whole surface of the LED chip, and a chip surface in contact with an n-type ohmic contact electrode is not covered by the metal reflective layer. Therefore, a reflectivity of a material of the n-type ohmic contact electrode would also affect the brightness of the LED chip. In addition, a reliability of the ohmic contact electrode is also a key research object.

SUMMARY

In one aspect, the disclosure provides a light-emitting diode. The light-emitting diode may include a light-emitting structure, a transparent conductive layer, a first insulating layer, a first electrode layer, a first pad electrode, and a second pad electrode. The light-emitting structure may include a first semiconductor layer, an active layer and a second semiconductor layer stacked in sequentially. The transparent conductive layer is formed on the light-emitting structure. The first insulating layer is disposed covering on the light-emitting structure and defined with a first opening to expose a portion of the first semiconductor layer. The first electrode layer is formed on the first insulating layer and in the first opening, and is electrically connected to the first semiconductor layer through the first opening. The first electrode layer may include a first metal reflective layer and a stress adjustment layer. The first metal reflective layer in the first opening is in contact with the first semiconductor layer and located between the first semiconductor layer and the stress adjustment layer. The first pad electrode is electrically connected to the first semiconductor layer, and the first electrode layer on the first insulating layer is in electrical contact with the first pad electrode. The second pad electrode is electrically connected to the second semiconductor layer. The first metal reflective layer and the stress adjustment layer contain a same metal element, and a content of the same metal element in the first metal reflective layer is greater than that in the stress adjustment layer.

In another aspect, the disclosure also provides a light-emitting diode. The light-emitting diode may include a light-emitting structure, a transparent conductive layer, a first insulating layer, a first electrode layer, a first pad electrode, a second pad electrode, and a metal adhesive layer. The light-emitting structure may include a first semiconductor layer, an active layer and a second semiconductor layer stacked in sequentially. The transparent conductive layer is formed on the light-emitting structure. The first insulating layer is disposed covering on the light-emitting structure and defined with a first opening to expose a portion of the first semiconductor layer. The first electrode layer is formed on the first insulating layer and in the first opening, and is electrically connected to the first semiconductor layer through the first opening. The first electrode layer may include a first metal reflective layer, and the first metal reflective layer contains a metal with a reflectivity greater than 70%. The first pad electrode is electrically connected to the first semiconductor layer, and the first electrode layer on the first insulating layer is in electrical contact with the first pad electrode. The second pad electrode is electrically connected to the second semiconductor layer. The metal adhesive layer is disposed at least between the exposed portion of the first semiconductor layer in the first opening and a portion of the first metal reflective layer formed in the first opening, and the metal adhesive layer may include at least one metal selected from chromium, titanium, and nickel.

In still another aspect, the disclosure also provides a light-emitting diode. The light-emitting diode may include a light-emitting structure, a transparent conductive layer, a first insulating layer, a first electrode layer, a second insulating layer, a first pad electrode, and a second pad electrode. The light-emitting structure may include a first semiconductor layer, an active layer and a second semiconductor layer stacked in sequentially in that order. The transparent conductive layer is formed on the light-emitting structure. The first insulating layer is disposed covering on the light-emitting structure and defined with a first opening to expose a portion of the first semiconductor layer. The first electrode layer is formed on the insulating layer and electrically connected to the first semiconductor through the first opening, and the first electrode may include a first metal reflective layer, an etch stop layer, and an adhesive layer. The first metal reflective layer in the first opening is in contact with the first semiconductor layer, and the etch stop layer is located between the first metal reflective layer and the adhesive layer. The second insulating layer is disposed covering on the first electrode layer and defined with a second opening to expose a portion of the first electrode layer, and the adhesive layer is in contact with the second insulating layer. The first pad electrode is electrically connected to the first semiconductor layer, and the first electrode layer on the first insulating layer is in electrical contact with the first pad electrode. The second pad electrode is electrically connected to the second semiconductor layer. The adhesive layer in the first electrode layer is defined with a through hole at least partially overlapped the second opening.

BRIEF DESCRIPTION OF DRAWINGS

By describing illustrative embodiments in detail with reference to the accompanying drawings, features will become clear to those skilled in the art.

DETAILED DESCRIPTION OF EMBODIMENTS

Figures 1, 2A, 2B:
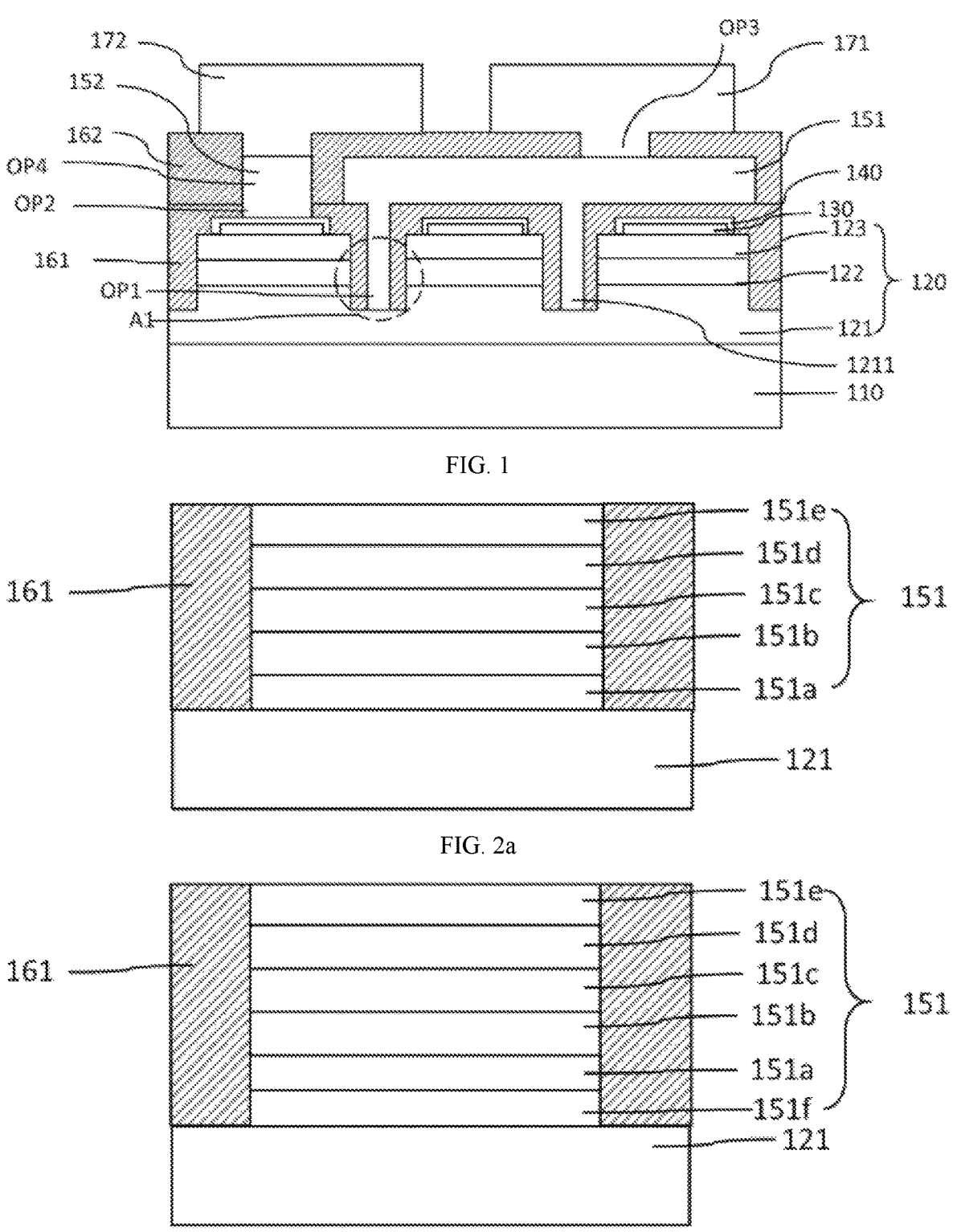
FIG. 1 illustrates a schematic cross-sectional view of a light-emitting diode according to an embodiment of the disclosure.
FIG. 2a illustrates a schematic enlarged view of a first electrode layer in the light-emitting diode at the portion A1 of FIG. 1, according to an embodiment of the disclosure.
FIG. 2*b* illustrates a schematic enlarged view of the first electrode layer in the light-emitting diode at the portion A1 of FIG. 1, according to another embodiment of the disclosure.

FIG. 1 illustrates a schematic cross-sectional view of a light-emitting diode according to an embodiment of the disclosure.

As shown in FIG. 1, the light-emitting diode according to the illustrated embodiment of the disclosure may include a substrate 110, a light-emitting structure 120, a transparent conductive layer 130, a first insulating layer 161, a first electrode layer 151, a second insulating layer 162, a first pad electrode 171, and a second pad electrode 172.

The substrate 110 may be formed by a carrier wafer suitable for growth of semiconductor materials. Moreover, the substrate 110 may be made of a material having excellent thermal conductivity, or may be an electrically conductive substrate or an electrically insulating substrate. In addition, the substrate 110 may be made of a light transmissive material and may have a mechanical strength that does not cause a bending of the entire light-emitting structure 120 and is capable of enabling effective division into separated chips by scribing and breaking processes. For example, the substrate 110 may be a sapphire (Al$_2$O$_3$) substrate, a silicon carbide (SiC) substrate, a silicon (Si) substrate, a zinc oxide (ZnO) substrate, a gallium nitride (GaN) substrate, a gallium arsenide (GaAs) substrate or a gallium phosphide (GaP) substrate, etc. In particular, the Al$_2$O$_3$ substrate is preferred. In this embodiment, the substrate 110 is a sapphire with a series of protrusions on its surface, including, for example, protrusions formed by dry etching without a fixed slope, or protrusions formed by wet etching with a certain slope.

The light-emitting structure 120 may include a first semiconductor layer 121, an active layer 122, and a second semiconductor layer 123 sequentially stacked on the substrate 110. The first semiconductor layer 121 and the second semiconductor layer 123 may have different electrically conductive types. When the first semiconductor layer 121 is an n-type semiconductor, the second semiconductor 123 is a p-type semiconductor; or vice versa. The active layer 122 is interposed between the first semiconductor layer 121 and the second semiconductor layer 123.

The first semiconductor layer 121, the active layer 122, and the second semiconductor layer 123 each may be formed of a group III nitride series compound semiconductor, for example, at least one of GaN, aluminum nitride (AlN), indium gallium nitride (InGaN), aluminium gallium nitride (AlGaN), and indium aluminum gallium nitride (InAlGaN). The first semiconductor layer 121 may be a layer that provides electrons and can be formed by injecting an n-type dopant (e.g., Si, germanium (Ge), selenium (Se), tellurium (Te), carbon (C), etc.). The second semiconductor layer 123 may be a layer that provides holes and can be formed by injecting a p-type dopant (e.g., magnesium (Mg), zinc (Zn), beryllium (Be), calcium (Ca), strontium (Sr), barium (Ba), etc.).

The active layer 122 is a layer in which electrons supplied from the first semiconductor layer 121 and holes supplied from the second semiconductor layer 123 are recombined to output light with a predetermined wavelength, and may be formed by multiple (i.e., more than one) semiconductor thin films of a single quantum well (SQW) structure or a multiple quantum well (MQW) structure with alternately stacked well layer and barrier layer. The active layer 122 may have different material compositions or ratios according to different wavelengths of output light. For example, an emission wavelength of the light-emitting diode of the illustrated embodiment of the disclosure is in a range of 420 nanometers (nm) to 580 nm. The active layer 122 may be formed as having one or more paired structures each of which includes a well layer and a barrier layer using groups III to V compound semiconductor materials (e.g., at least one of InGaN/GaN, InGaN/InGaN, GaN/AlGaN, InAlGaN/GaN, GaAs(InGaAs)/AlGaAs, and GaP(InGaP)/AlGaP), but the disclosure is not limited thereto. The well layer may be formed of a material with an energy bandgap smaller than that of the barrier layer.

A local recess region 1211 is located on a part of the second semiconductor layer 123 and extends downwards to the first semiconductor layer 121 to form a mesa structure. The mesa structure exposes side walls of an epitaxially grown structure. Specifically, the mesa structure exposes a mesa of the first semiconductor layer 121 and side walls of the first semiconductor layer 121, the active layer 122 and the second semiconductor layer 123. It should be noted that the number of the local recess region 1211 is at least one, which can also be increased according to the structure and area size of the light-emitting diode (LED) chip.

The transparent conductive layer 130 is formed on the light-emitting structure 120 and is in contact with the second semiconductor layer 123. The transparent conductive layer 130 can enhance the spreading of current and form an ohmic contact with the second semiconductor layer 123. A material of the transparent conductive layer 130 may be indium tin oxide (ITO), indium oxide (InO), stannous oxide (SnO), cobalt doped tin oxide (CTO), antimony doped tin oxide (ATO), zinc oxide (ZnO), gallium phosphide (GaP), or a combination thereof. The transparent conductive layer 130 may be formed by evaporation or sputter coating. In this embodiment, a thickness of the transparent conductive layer 130 is in a range of 5 nm to 100 nm. In addition, the thickness of the transparent conductive layer 130 preferably is in a range of 10 nm to 50 nm.

The light-emitting diode may further include a second metal reflective layer 140 disposed on the transparent conductive layer 130. In an embodiment, the second metal reflective layer 140 may be coated with a metal protective layer. As an example, the second metal reflective layer 140 may be deposited on the transparent conductive layer 130 by a deposition process such as a physical vapor deposition (PVD) process or a magnetron sputtering process. For example, when a high reflective metal such as aluminium (Al) or silver (Ag) is selected as a mirror, the metal protective layer may be selected from titanium tungsten (TiW), nickel (Ni), chromium (Cr), platinum (Pt), and titanium (Ti), etc. In an alternative embodiment, the second metal reflective layer 140 may not be provided.

The first insulating layer 161 is disposed covering the light-emitting structure 120. The first insulating layer 161 encloses side walls of the second metal reflective layer 140, side walls of the transparent conductive layer 130, and side walls of adjacent light-emitting structures 120. In an illustrated embodiment, a first opening OP1 is formed in the first insulating layer 161, and the first opening OP1 may penetrate through the first insulating layer 161 to expose the local recess region 1211 and expose a surface of the first semiconductor layer 121. The first insulating layer 161 may be made of silicon oxide, silicon nitride or aluminum oxide. In some embodiments, the first insulating layer 161 may have a structure in which a first sub insulating layer and a second sub insulating layer are alternately and repeatedly stacked. Herein, refractive indexes of the first sub insulating layer and the second sub insulating layer may be lower than a refractive index of the second semiconductor layer 123, and the refractive indexes of the first sub insulating layer and the second sub insulating layer may be different from each other. For example, the first sub insulating layer may be formed of a silicon oxide ($SiO_2$) layer, and the second sub insulating layer may be formed of a titanium oxide ($TiO_2$) layer or a niobium oxide ($Nb_2O_5$) layer. Therefore, the first insulating layer may have an omni-directional reflection (ODR) structure or a distributed Bragg reflection (DBR) structure.

The first electrode layer 151 is formed on the first insulating layer 161 and in the first opening OP1, and is electrically connected to the first semiconductor layer 121 through the first opening OP1. The first electrode layer 151 may include multiple layers. Specifically, the first electrode layer 151 includes a first metal reflective layer 151*a* in contact with the first semiconductor layer 121, a diffusion prevention layer 151*b* formed on the first metal reflective layer 151*a*, a stress adjustment layer 151*c* formed on the diffusion prevention layer 151*b*, an etch stop layer 151*d* formed on the stress adjustment layer 151*c*, and an adhesive layer 151*e* formed on the etch stop layer 151*d*.

FIG. 2*a* illustrates a schematic enlarged view of the first electrode layer of the light-emitting diode at the portion A1 of FIG. 1.

As shown in FIG. 2*a*, the first metal reflective layer 151*a*, the diffusion prevention layer 151*b*, the stress adjustment layer 151*c*, the etch stop layer 151*d*, and the adhesive layer 151*e* are sequentially stacked in that order on the first semiconductor layer 121.

Preferably, the first metal reflective layer 151*a* may include a material in contact with the first semiconductor layer 121. In an ordinary fabrication process, Cr metal is usually used as the material in contact with the first semiconductor layer 121, but the reflectivity of the metal material in contact with the first semiconductor layer 121 would also affect the brightness of the light-emitting diode. However, the reflectivity of the Cr metal is not high enough, and therefore the chromium (Cr) layer is removed to allow a metal with high reflectivity to be in direct contact with the first semiconductor layer 121 to increase the reflectivity of the first electrode layer 151, thereby can increase the reflection efficiency of incident light and improve the brightness of light-emitting diode. For example, the first metal reflective layer 151*a* may be formed of a metal having a reflectivity greater than 70%, such as Al, Ag, or rhodium (Rh).

In addition, a thickness of the first metal reflective layer 151*a* may be in a range of 100 nm to 500 nm. For example, if the thickness of the first metal reflective layer 151*a* is less than 100 nm, the reflection effect is poor; and if the thickness of the first metal reflective layer 151*a* is greater than 500 nm, which would lead to reduction in reflectivity of the first metal reflective layer 151*a* resulting from migration and diffusion caused by a poor coverage of the diffusion prevention layer 151*b* to the first metal reflective layer 151*a* in a subsequent process. In an embodiment, the first metal reflective layer 151*a* preferably is Al metal with a thickness in a range of 120 nm to 350 nm, so that the reflectivity of the first electrode layer 151 can reach more than 85% and achieve excellent ohmic contact effect.

As an alternative embodiment, FIG. 2*b* illustrates that a thin metal adhesive layer 151*f* is formed between the first semiconductor 121 and the first metal reflective layer 151*a*. It is mentioned above that, the reflectivity of the metal material of the first electrode layer 151 in contact with the first semiconductor layer 121 may affect the brightness of the light-emitting diode. Therefore, the thin metal adhesive layer 151*f* can be disposed between the first semiconductor 121 and the first metal reflective layer 151*a*, and a thickness of the metal adhesive layer 151*f* is as thin as possible, so that the first electrode layer 151 can achieve good adhesion with the first semiconductor layer 121, and meanwhile it can reduce the influence of the metal adhesive layer 151*f* on the reflectivity of the first electrode layer 151 as much as possible. The metal adhesive layer 151*f* may include a metal such as Cr, Ni or Ti. The metal adhesive layer 151*f* may have the thickness in a range of 0.5 nm to 10 nm. In a preferred embodiment, the thickness of the metal adhesive layer 151*f* is preferably in range of 1 nm to 3 nm.

The diffusion prevention layer 151*b* may be disposed on the first metal reflective layer 151*a* and configured (i.e., structured and arranged) to prevent migration and diffusion of a metal element of the first metal reflective layer 151*a*. The diffusion prevention layer 151*b* may be formed of a single layer or multiple layers of at least one of Ti, TiW, Ni, Pt, Cr, Zn, palladium (Pb), Rh, iridium (Ir), ruthenium (Ru), tungsten (W) and Cu. A thickness of the diffusion prevention layer 151*b* is in a range of 50-500 nm. If the thickness of the diffusion prevention layer is less than 50 nm, the diffusion prevention layer 151*b* is not enough to prevent the migration of the metal element; and if the thickness is greater than 500 nm, electrical characteristics of the diffusion prevention layer 151*b* would be deteriorated due to an increase in specific resistance. Therefore, the thickness of the diffusion prevention layer 151*b* preferably is in a range of 50-300 nm. In an embodiment, the diffusion prevention layer 151*b* preferably is made of Ti, so that stable ohmic characteristics and reflection characteristics can be maintained by preventing migration and diffusion of the material (e.g., Al) of the first metal reflective layer 151*a*.

The stress adjustment layer 151*c* may be disposed on the diffusion prevention layer 151*b*. Since the first electrode layer 151 needs a certain thickness, it is necessary to form a metal stack with a certain thickness in the structure of the first electrode layer 151, and in this case, the stress between metal stacks needs to be considered to ensure the overall quality of the first electrode layer 151 and improve the reliability of the first electrode layer 151. Therefore, it is necessary to dispose the stress adjustment layer 151*c* on the diffusion prevention layer 151*b*. The stress adjustment layer 151*c* may be mainly formed of at least one metal selected from Al, Ni, Cr, gold (Au), Cu and Pt, or a metal alloy thereof. In addition, a thickness of the stress adjustment layer 151*c* is in a range of 100-500 nm. In an embodiment, the stress adjustment layer 151*c* is preferably formed of an alloy material containing Al, for example, a Cu—Al alloy. The Cu—Al alloy has the characteristics of good thermal stability, small stress, excellent electrical and thermal conductivity and low cost, so that the first electrode layer 151 can achieve advantages of excellent ohmic contact effect and high reflectivity, and meanwhile the reliability of the first electrode layer 151 can be taken into account.

Figures 2C, 3, 4A:
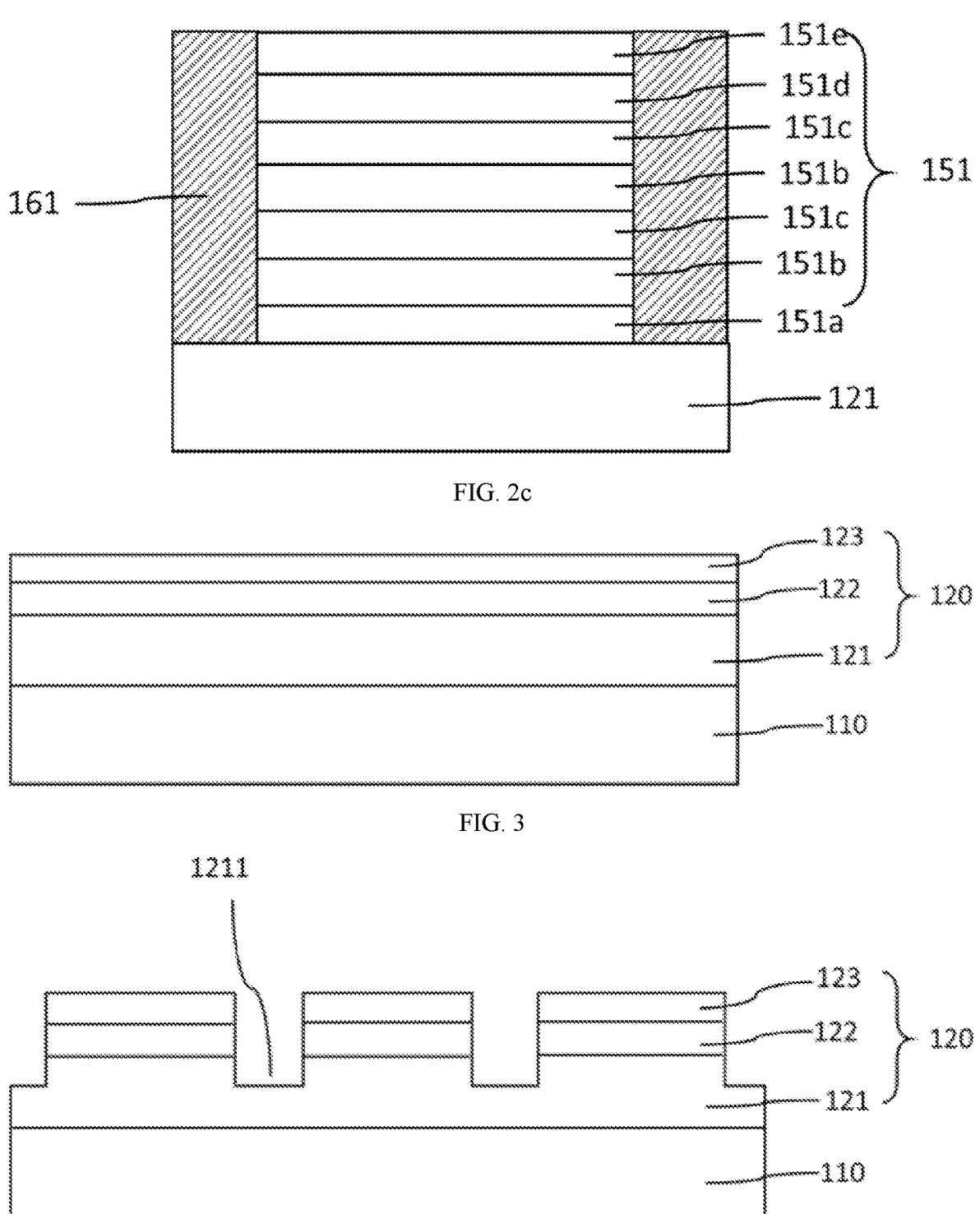
FIG. 2*c* illustrates a schematic enlarged view of the first electrode layer in the light-emitting diode at the portion A1 of FIG. 1, according to still another embodiment of the disclosure.
FIGS. 3 through 11 illustrate schematic structural views associated with a fabrication method of a light-emitting diode according to an embodiment of the disclosure.

In addition, the diffusion prevention layer 151*b* and the stress adjustment layer 151*c* may be alternately stacked multiple times. As shown in FIG. 2c, the diffusion prevention layer 151b and the stress adjustment layer 151c may be alternately stacked twice.

In an embodiment, the first metal reflective layer 151a and the stress adjustment layer 151c contain a same metal element, and a content of the same metal element in the first metal reflective layer 151a is greater than that in the stress adjustment layer 151c. As a result, the obtained first electrode layer 151 not only has high reflectivity and good ohmic contact effect, but also takes into account the advantages of high reliability, low stress, good electrical and thermal conductivity and low cost. The reflectivity of the same metal element is greater than 70%. For example, the first metal reflective layer 151a is made of Al metal, the stress adjustment layer 151c is made of Al alloy, and the Al content of the first metal reflective layer 151a is greater than that of the stress adjustment layer 151c.

The etch stop layer 151d may be disposed on the stress adjustment layer 151c. The etch stop layer 153 is configured to protect a metal(s) vulnerable to be corroded in the first electrode layer 151 in a subsequent etching process of forming a third opening OP3 in the second insulating layer 162. Particularly, the etch stop layer 153 is configured to prevent damage to the metal vulnerable to be corroded in the stress adjustment layer 151c and the first metal reflective layer 151a, such as Al. The etch stop layer 151d is preferably formed as a single layer or multiple layers of at least one of Cr, Pt, Ni, W, TiW, Au and Ti. The etch stop layer may have a thickness in a range of 5 nm to 2000 nm. In an embodiment, a wet etching process is employed, and the etch stop layer 151d is preferably formed of Cr and Pt. A thickness of Cr is preferably in a range of 10 nm to 100 nm, and a thickness of Pt is preferably in range of 5 nm to 300 nm. In another embodiment, a dry etching process is employed, and the etch stop layer 151d is preferably composed of Au/Ti/Pt.

Figure 11:
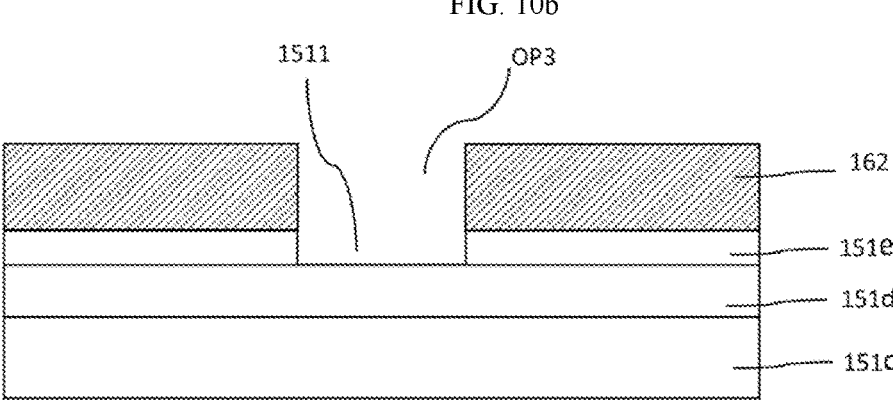

The adhesive layer 151e is formed on the etch stop layer 151d. Since the adhesion between the etch stop layer 151d and the second insulating layer 162 in the subsequent process is relatively poor, herein a thin adhesive layer 151e is necessary to be added to increase the adhesion between the etch stop layer 151d and the second insulating layer 162. Therefore, the adhesive layer 151e is in contact with the second insulating layer 162. The adhesion layer 151e has better adhesion to silicon dioxide or aluminum oxide, which is beneficial to improve the protective performance of the second insulating layer 162, maintain a bonding force with the second insulating layer 162 and improve the reliability. The adhesive layer 151e may be composed of Ti, Cr, etc. In an embodiment, the adhesive layer is preferably Ti and a thickness thereof is preferably in a range of 2 nm to 20 nm. As shown in FIG. 11, which illustrates a schematic enlarged view of partial structure of the first electrode layer 151 and the second insulating layer 162 at the portion A2 in FIGS. 9a-9b, since an etching solution or etching gas in a subsequent etching process of forming the third opening OP3 in the second insulating layer 162 may corrode the adhesive layer 151e, the adhesive layer 151e would be formed with a through hole 1511 at least overlapped with the third opening OP3.

In addition, as shown in FIG. 1, the first insulating layer 161 is further formed with a second opening OP2, to expose a partial surface of the second metal reflection layer 140.

The light-emitting diode may further include a second electrode layer 152 formed in the second opening OP2. The second electrode layer 152 is in contact with the second metal reflection layer 140. In an embodiment, when the light-emitting diode is not provided with the second metal reflection layer 140, the second electrode layer 152 is disposed on the transparent conductive layer 130, and the second electrode layer 152 is in contact with the transparent conductive layer 130 instead.

In an embodiment, the second electrode layer 152 and the first electrode layer 151 may contain the same metal material and/or have the same metal stack.

In an alternative embodiment, the second electrode layer 152 may not be provided.

The light-emitting diode may further include the second insulating layer 162 formed on the first electrode layer 151. The second insulating layer 162 covers the first electrode layer 151, and a material of the second insulating layer 162 may be the same as or different from that of the first insulating layer 161. The second insulating layer 162 is defined with the third opening OP3 and a fourth opening OP4. The third opening OP3 exposes a partial surface of the first electrode layer 151. The fourth opening OP4 penetrates through the second insulating layer 162 and exposes a partial surface of the second electrode layer 152. A size of the fourth opening OP4 of the second insulating layer may be the same as or different from that of the second opening OP2 of the first insulating layer.

The LED structure described in disclosure is applicable to a lateral chip, a flip chip, a vertical chip, etc. The light-emitting diode of the illustrated embodiment of the disclosure takes the flip chip as an example, in which a first pad electrode 171 and a second pad electrode 172 both may be disposed on a side of the light-emitting structure 120. Herein, the side may be a side facing away from a main light-emitting surface of the light-emitting structure 120.

The first pad electrode 171 may be electrically connected to the first semiconductor layer 121 of the light-emitting structure 120, and the second pad electrode 172 may be electrically connected to the second semiconductor layer 123.

The first pad electrode 171 is in contact with the first electrode layer 151 through the third opening OP3. Specifically, the first pad electrode 171 is in contact with the etch stop layer 151d through the third opening OP3 and the through hole 1511. The second pad electrode 172 is in contact with the second electrode layer 152 through the fourth opening OP4, and the second electrode layer 152 is located between the second semiconductor layer 123 and the second pad electrode 172. The first pad electrode 171 may be electrically connected to the first semiconductor layer 121 of the light-emitting structure 120, and the second pad electrode 172 may be electrically connected to the second semiconductor layer 123.

In an embodiment, in the etching process of forming the fourth opening OP4 in the second insulating layer 162, the same problem as the above forming the third opening OP3 may be encountered, an adhesive layer in the second electrode layer 152 may also be corroded by an etching solution or an etching gas, so that the adhesive layer in the second electrode layer 152 is formed with a through hole at least overlapped with the fourth opening OP4.

Next, a process of fabricating the light-emitting diode according to the illustrated embodiment will be described with reference to FIGS. 3 through 10.

As shown in FIG. 3, a light-emitting structure 120 may be formed on a substrate 110. The light-emitting structure 120 may include a first semiconductor layer 121, an active layer 122, and a second semiconductor layer 123 sequentially stacked in that order on the substrate 110. The first semiconductor layer 121, the active layer 122, and the second semiconductor layer 123 may include the above layers formed on the substrate 110 using a process such as metal organic chemical vapor deposition (MOCVD), hydride vapor epitaxy (HVPE), molecular beam epitaxy (MBE), or the like.

Figure 4B:
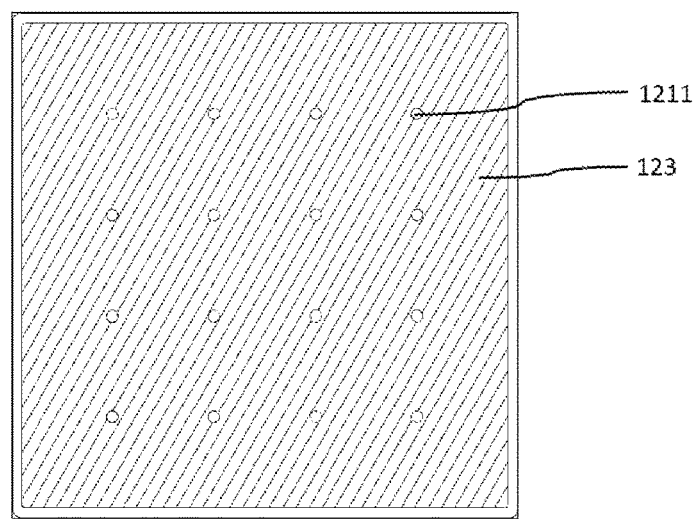

As shown in FIGS. 4a-4b, a part of the light-emitting structure 120 may be etched off to expose a part of the first semiconductor layer 121 and thereby form a local recess region 1211. The local recess region 1211 exposes side walls of the light-emitting structure 120. Specifically, the local recess region 1211 exposes a mesa of the first semiconductor layer 121 and side walls of the first semiconductor layer 121, the active layer 122 and the second semiconductor layer 123. For example, the local recess region 1211 may be formed by etching in the light-emitting structure 120 by an inductively coupled plasma (ICP) etching process or a reactive-ion etching (RIE) process, so that the side walls of the first semiconductor layer 121, the active layer 122 and the second semiconductor layer 123 are exposed by the local recess region 1211. The mesa of the first semiconductor layer 121 is used for a subsequent electrical connection with the first pad electrode 171.

Figure 5A:
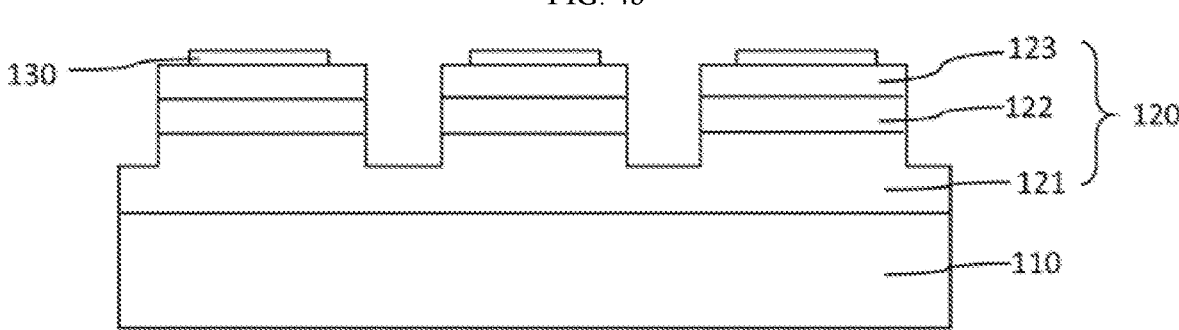
Figure 5B:
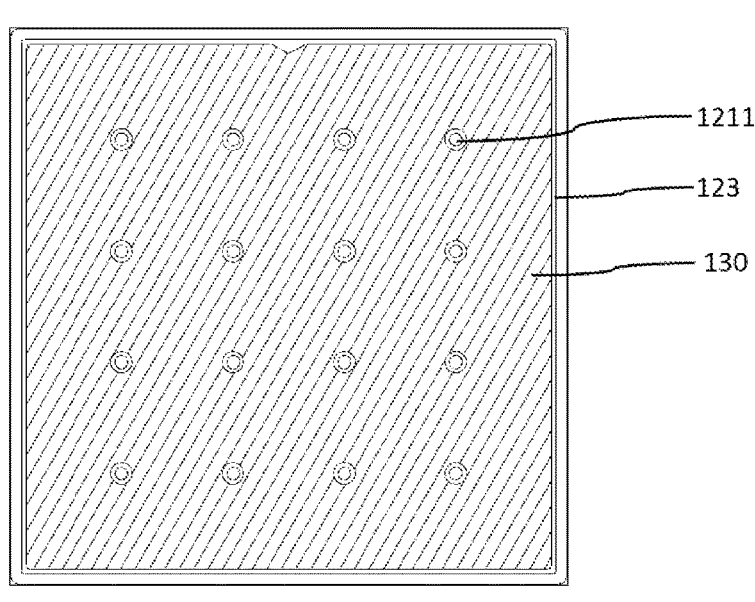

As shown in FIGS. 5a-5b, a transparent conductive layer 130 may be formed on a partial surface of the light-emitting structure 120. For example, the transparent conductive layer 130 may be formed by evaporation or sputtering, to form an ohmic contact with the second semiconductor layer 123 in the light-emitting structure 120.

Figure 6A:
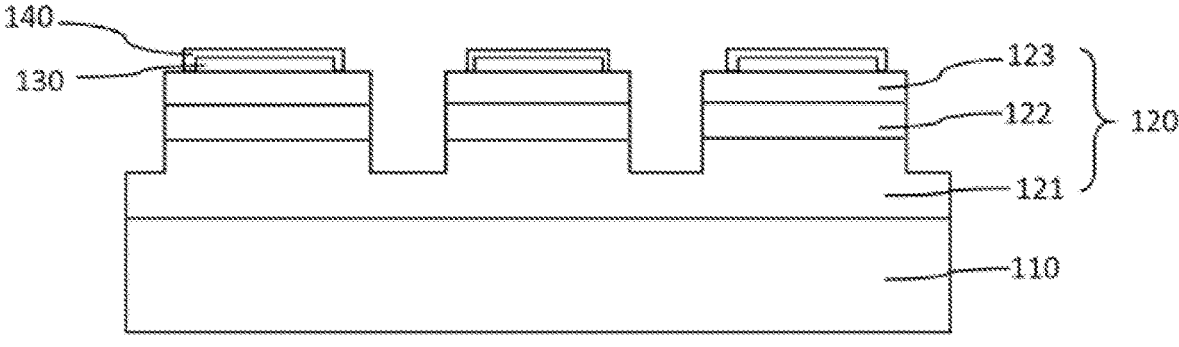
Figure 6B:
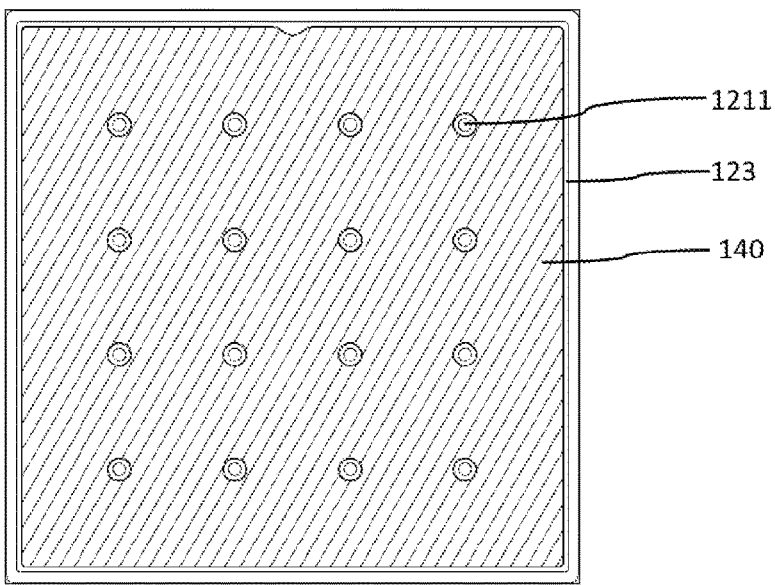

As shown in FIGS. 6a-6b, a second metal reflective layer 140 may be formed on a surface of the transparent conductive layer 130. In an embodiment, a metal protective layer is coated on the second metal reflective layer 140. As an example, the second metal reflective layer 140 may be deposited on the transparent conductive layer 130 by a deposition process such as a PVD process or a magnetron sputtering process. For example, when the high reflective metal such as Al or Ag is selected as a mirror, the metal protective layer may be selected from TiW, Ni, Cr, Pt, Ti, etc.

Figure 7A:
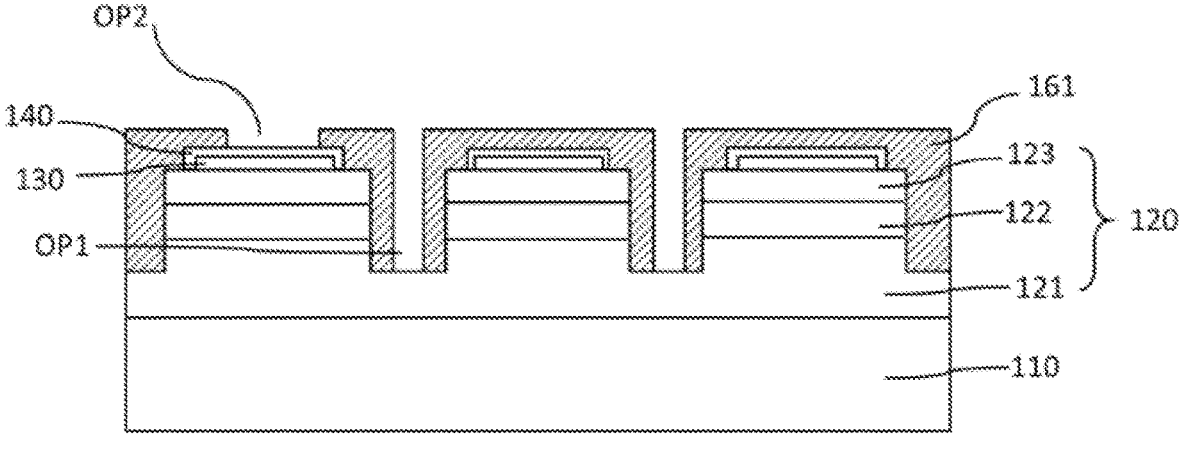
Figure 7B:
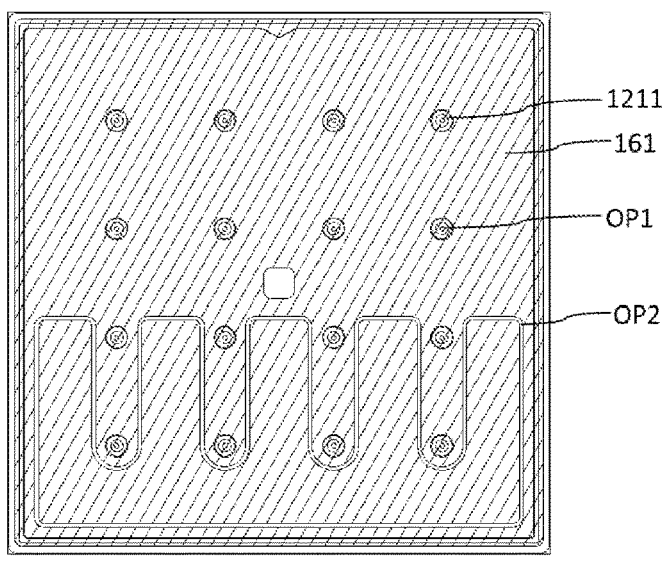

As shown in FIGS. 7a-7b, a first insulating layer 161 may be formed on the light-emitting structure 120 with the second metal reflective layer 140. The first insulating layer 161 encloses side walls of the second metal reflective layer 140, side walls of the transparent conductive layer 130 and adjacent side walls of the light-emitting structure 120. In addition, a series of first openings OP1 and second openings OP2 may be formed by etching part of the first insulating layer 161 through photolithography and etching processes. The first opening OP1 may penetrate through the first insulating layer 161 to expose the local recess region 1211 and expose a surface of the first semiconductor layer 121. The number of the first opening OP1 is identical to the number of the local recess region 1211. The second opening OP2 penetrates through the first insulating layer 161 to expose a partial surface of the second metal reflection layer 140. As an example, the first insulating layer 161 may be formed by a chemical vapor deposition process, and the first insulating layer 161 may be a single layer formed by a silicon dioxide ($SiO_2$) layer.

Figure 8A:
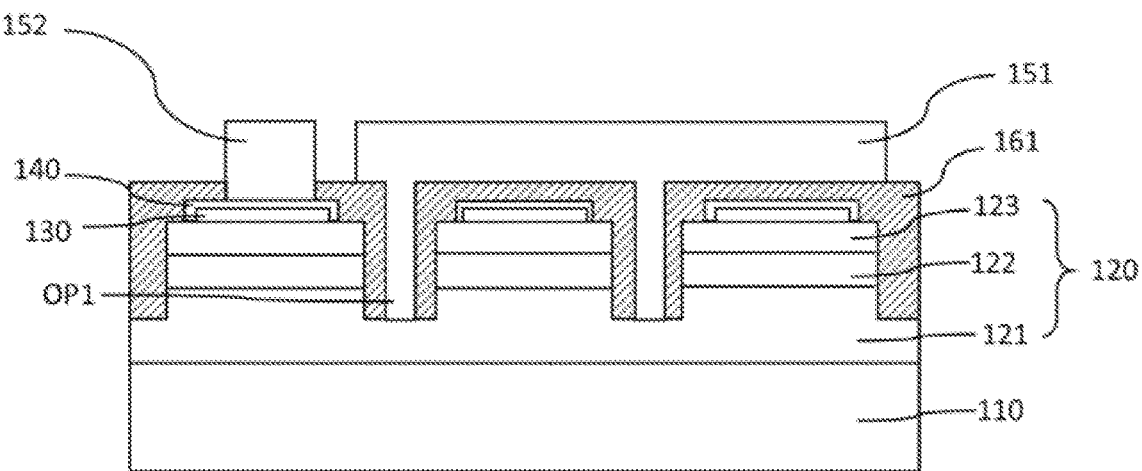
Figure 8B:
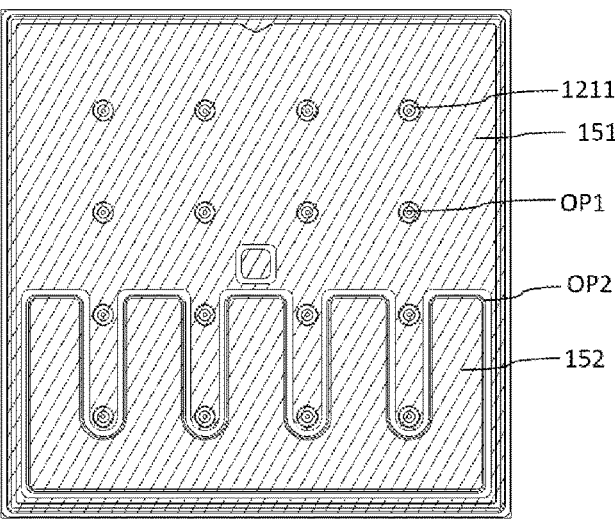

As shown in FIGS. 8a-8b and FIG. 2a, a first electrode layer 151 may be formed in the first insulating layer 161 and the first opening OP1. The first electrode layer 151 is in electrical contact with the first semiconductor layer 121 through the first opening OP1. The first electrode layer 151 may include multiple layers. For example, the first electrode layer 151 includes the first metal reflective layer 151a in contact with the first semiconductor layer 121, the diffusion prevention layer 151b formed on the first metal reflective layer 151a, the stress adjustment layer 151c formed on the diffusion prevention layer 151b, the etch stop layer 151d formed on the stress adjustment layer 151c, and the adhesive layer 151e formed on the etch stop layer 151d.

The first metal reflective layer 151a is preferably composed of a material in good electrical contact with the first semiconductor layer 121, and has high reflectivity to improve the reflectivity of the first electrode layer 151. In an ordinary fabrication process, Cr metal is usually used as the material in contact with the first semiconductor layer 121, but the reflectivity of the metal material in contact with the first semiconductor layer 121 would also affect the brightness of the light-emitting diode. However, the reflectivity of Cr metal is not high enough, and therefore the chromium layer is removed to allow a metal with a high reflectivity to be in contact with the first semiconductor layer 121 to increase the reflectivity of the first electrode layer 151, thereby increasing a reflection efficiency of incident light and improving the brightness of the light-emitting diode. For example, the first metal reflective layer 151a may be formed of a metal having a reflectivity greater than 70%, such as Al, Ag, or Rh. The thickness of the first metal reflective layer 151a may be, for example, in the range of 100 nm to 500 nm. For example, when the thickness of the first metal reflective layer 151a is less than 100 nm, the reflection effect is relatively poor; and when the thickness of the first metal reflective layer 151a is greater than 500 nm, which would lead to the reduction in reflectivity of the first metal reflective layer 151a resulting from migration and diffusion caused by poor coverage of the diffusion prevention layer 151b onto the first metal reflective layer 151a in a subsequent process. In an embodiment, the first metal reflective layer 151a is preferably Al metal with a thickness in a range of 120 nm to 350 nm, so that the reflectivity of the first electrode layer 151 can reach more than 85% and has excellent ohmic contact effect.

Herein, it should be noted that if the first metal reflective layer 151a is directly deposited or evaporated on the first semiconductor layer 121, the first metal reflective layer 151a cannot form a good ohmic contact with the first semiconductor layer 121. Therefore, in order to improve the ohmic contact quality of the first electrode layer 151, the surface of the first semiconductor layer 121 should be treated by plasma of oxygen ($O_2$), nitrogen ($N_2$), argon (Ar) or hydrogen (Hz) under a high vacuum condition, to remove an oxide film on the surface of the first semiconductor layer 121 by physical bombardment of the plasma, so as to effectively reduce a potential barrier of the surface. After the treatment, the first metal reflective layer 151a and the subsequent metal layers can be deposited or evaporated. Moreover, the first metal reflective layer 151a is made of a metal rather than an alloy, because the alloy material cannot form a good ohmic contact with the first semiconductor layer 121 even after the surface of the first semiconductor layer is treated with the plasma of $O_2$, $N_2$, Ar or Hz.

The diffusion prevention layer 151b may be disposed on the first metal reflective layer 151a and configured to prevent migration and diffusion of a metal element of the first metal reflective layer 151a.

The stress adjustment layer 151c may be disposed on the diffusion prevention layer 151b, and the diffusion prevention layer 151b is located between the first metal reflective layer 151a and the stress adjustment layer 151c.

The etch stop layer 151d may be disposed on the stress adjustment layer 151c. The etch stop layer 153 is used to protect metal layers vulnerable to be corroded in the first electrode layer 151 in a subsequent etching process of forming a third opening OP3 in the second insulating layer 162. Particularly, the etch stop layer 153 is configured to prevent damage to the metal vulnerable to be corroded in the stress adjustment layer 151c and the first metal reflective layer 151a, such as Al.

The adhesive layer 151e is formed on the etch stop layer 151d.

As shown in FIGS. 8a-8b, a second electrode layer 152 may be formed in the second opening OP2 of the first insulating layer 161, and the second electrode layer 152 is in contact with the second metal reflection layer 140. In an embodiment, the light-emitting diode is not provided the second metal reflection layer 140 on the transparent conductive layer 130, and in this case, the second electrode layer 152 is disposed in contact with the transparent conductive layer 130 instead.

In an embodiment, the second electrode layer 152 and the first electrode layer 151 contain a same metal material and/or have a same metal stack.

Figure 9A:
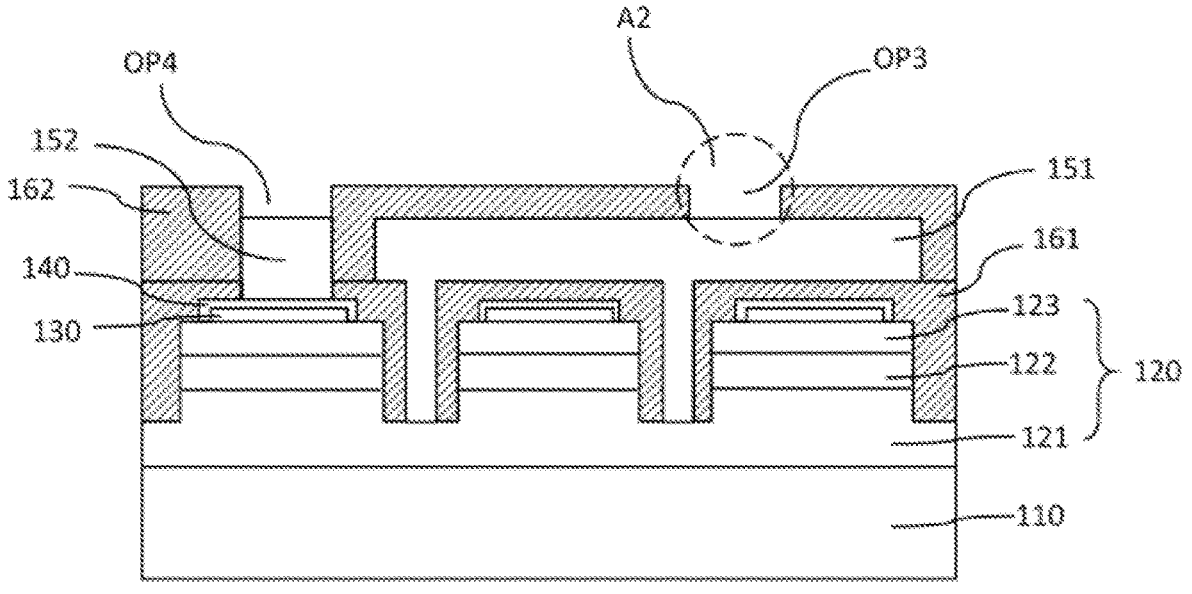
Figure 9B:
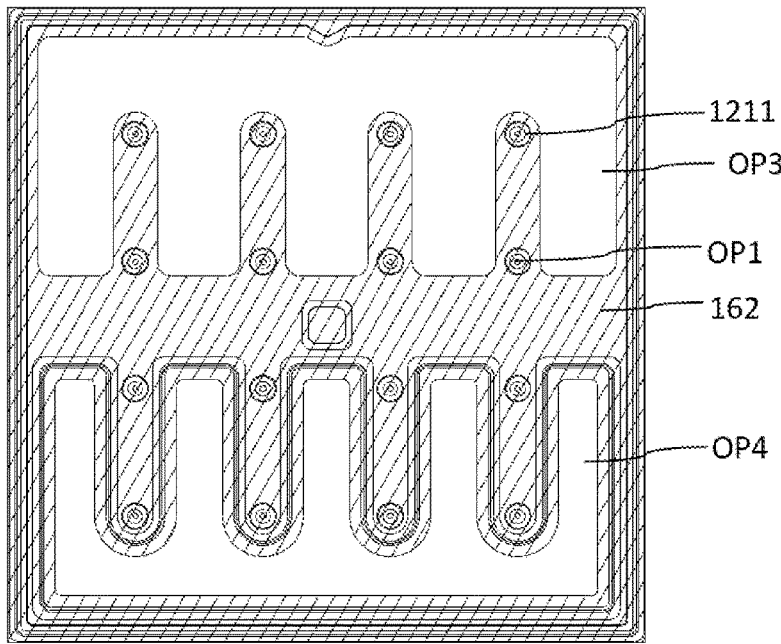

As shown in FIGS. 9a-9b, a second insulating layer 162 may be formed on the first electrode layer 151, and have a third opening OP3 and a fourth opening OP4 defined therein. The third opening OP3 exposes a partial surface of the first electrode layer 151, and the fourth opening OP4 exposes a partial surface of the second electrode layer 152. The second insulating layer 162 covers side walls of the first electrode layer 151 and the second electrode layer 152. The third opening OP3 and the fourth opening OP4 are formed in the second insulating layer 162. The third opening OP3 and the fourth opening OP4 expose portions of the first electrode layer 151 and the second electrode layer 152 by an etching process. As shown in FIG. 11, since an etching solution or an etching gas in the etching process of forming the third opening OP3 and the fourth opening OP4 in the second insulating layer 162 may corrode the adhesive layer 151e, so that the adhesive layer 151e is formed with through holes 1511 at least overlapped with the third opening OP3 and the fourth opening OP4.

In an embodiment, the third opening OP3 and the fourth opening OP4 are defined by a wet etching process. As an etching solution of the second insulating layer 162, hydrogen fluoride (HF), buffered oxide etch (BOE), nitric acid (HNO₃), hydrogen chloride (HCl), or the like may be used alone or combined with an appropriate concentration. Therefore, in order to prevent damage to the Al metal in the stress adjustment layer 151c and the first metal reflective layer 151a, the etch stop layer 151d is formed of Cr and Pt. The thickness of Cr is preferably in a range of 10 nm to 100 nm, and the thickness of Pt is preferably in a range of 5 nm to 300 nm. Consequently, the etch stop layer 151d can effectively prevent the etching solution from damaging Al in the stress adjustment layer 151c and the first metal reflective layer 151c. As an example, the first electrode layer 151 constitutes a structure of Al (first metal reflective layer 151a)/Ti (diffusion prevention layer 151b)/Al (stress adjustment layer 151c)/Ti (diffusion prevention layer 151b)/Al (stress adjustment layer 151c)/Cr/Pt (etch stop layer 151d)/Ti (adhesive layer 151e) sequentially stacked in that order. As a result, the obtained first electrode layer 151 can be free from the influence of other processes in the subsequent processes of the light-emitting diode, thereby can ensure the stability and reflectivity of the first electrode layer 151.

In another embodiment, the third opening OP3 and the fourth opening OP4 are defined by a dry etching process. In this case, a halogen gas containing a fluorine (F) radical (e.g., tetrafluoromethane (CF₄), hexafluoroethane (C₂F₆), octafluoropropane (C₃F₈), sulfur hexafluoride (SF₆), or the like) can be used as an etching gas in the dry etching process. Since the etching gas is extremely active to the Al element, the etch stop layer 151d is preferably composed of a material with excellent etching selection ratio in such dry etching process. For example, noble metal materials such as Au and Pt can be used. In an embodiment, the etch stop layer 151d can be composed of Au/Ti/Pt. As an example, the first electrode layer 151 is composed of Al (first metal reflective layer 151a)/Ti (diffusion prevention layer 151b)/Pt (stress adjustment layer 151c)/Ti (diffusion prevention layer 151b)/Pt (stress adjustment layer 151c)/Ti (diffusion prevention layer 151b)/Pt (stress adjustment layer 151c)/Au/Ti/Pt (etch stop layer 151d)/Ti (adhesive layer 151e) stacked sequentially. As a result, the obtained first electrode layer 151 can be free from the influence of other processes in subsequent processes of the light-emitting diode, thereby can ensure the stability and reflectivity of the first electrode layer 151.

Figure 10A:
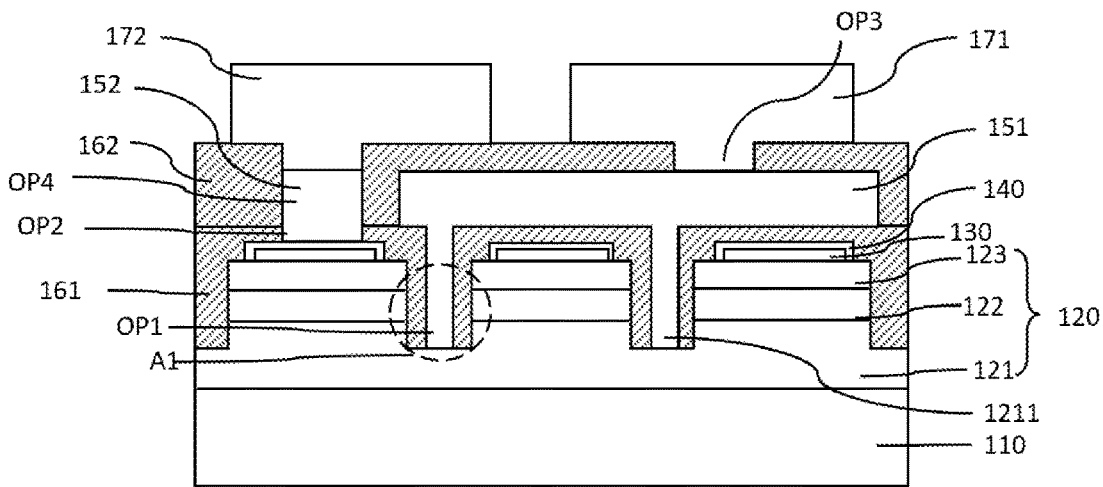
Figure 10B:
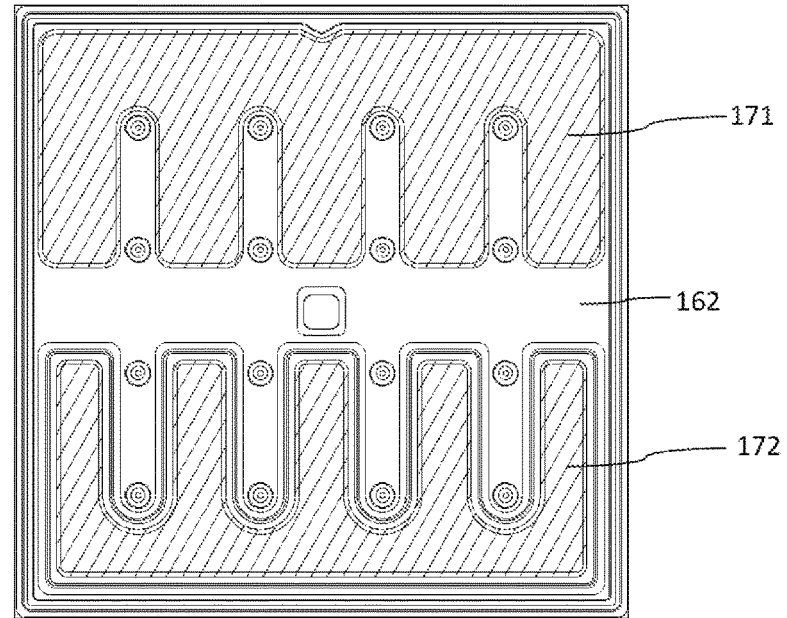

As shown in FIGS. 10a-10b, the first pad electrode 171 and the second pad electrode 172 are fabricated on the second insulating layer 162. The first pad electrode 171 is in contact with the first electrode layer 151 through the third opening OP3 and the through hole 1511. Specifically, the first pad electrode 171 is in contact with the etch stop layer 151d through the third opening OP3 and the through hole 1511. The second pad electrode 172 is in contact with the second electrode layer 152 through the fourth opening OP4, and the second electrode layer 152 is located between the second semiconductor layer 123 and the second pad electrode 172. The first pad electrode 171 may be electrically connected to the first semiconductor layer 121 of the light-emitting structure 120, and the second pad electrode 172 may be electrically connected to the second semiconductor layer 123.

As described above, the disclosure provides the light-emitting diode and the fabrication method thereof and may at least have beneficial technical effects as follows.

(1) the first metal reflective layer with a high reflectivity is in direct contact with the first semiconductor layer, the disclosure not only can realize good ohmic contact effect, but also can increase the reflectivity of the first electrode layer, thereby can increase the reflection efficiency of incident light and improve the brightness of light-emitting diode.

(2) the first electrode layer of the disclosure may include the first metal reflective layer with a high reflectivity and the stress adjustment layer disposed above the first metal reflective layer, the first metal reflective layer and the stress adjustment layer contain a same metal element, and a content of the same metal element in the first metal reflective layer is greater than that in the stress adjustment layer, so that the first electrode layer not only can achieve a high reflectivity and good ohmic contact effect, but also can achieve the advantages of high reliability, low stress, good electrical and thermal conductivity, and low cost.

(3) the metal adhesive layer as thin as possible is arranged between the first semiconductor layer and the first metal reflective layer, the disclosure not only can enable the first electrode layer to achieve good adhesion with the first semiconductor layer, but also can reduce the influence of the metal adhesive layer on the reflectivity of the first electrode layer as much as possible, thereby can increase the reflection efficiency of incident light and improve the brightness of the light-emitting diode.

(4) the first electrode layer of the disclosure may include the first metal reflective layer, the etch stop layer and the adhesive layer, so that the first electrode layer cannot be affected by other processes in subsequent processes of the light-emitting diode, thereby can ensure the stability and reflectivity of the first electrode layer.

What is claimed is:

1. A light-emitting diode, comprising:
a light-emitting structure, including a first semiconductor layer, an active layer and a second semiconductor layer stacked sequentially;
a first insulating layer, covering the light-emitting structure and defined with a first opening to expose a portion of the first semiconductor layer; and
a first electrode layer, formed on the first insulating layer and in the first opening, and electrically connected to the first semiconductor layer through the first opening; wherein the first electrode layer includes a first metal reflective layer and a stress adjustment layer, and the first metal reflective layer is located between the first semiconductor layer and the stress adjustment layer;
wherein the first metal reflective layer and the stress adjustment layer contain a same metal element, a content of the same metal element in the first metal reflective layer is greater than that in the stress adjustment layer, and the same metal element is aluminum;
wherein the light-emitting diode further comprises a metal adhesive layer, and the metal adhesive layer is disposed between the exposed portion of the first semiconductor layer in the first opening and a portion of the first metal reflective layer in the first opening;
wherein the first electrode layer further comprises a diffusion prevention layer, an etch stop layer, and an adhesive layer; and
wherein the first metal reflective layer is located between the metal adhesive layer and the diffusion prevention layer, the diffusion prevention layer is located between the first metal reflective layer and the stress adjustment layer, the stress adjustment layer is located between the diffusion prevention layer and the etch stop layer, and the etch stop layer is located between the stress adjustment layer and the adhesive layer.

2. The light-emitting diode according to claim 1, wherein the first metal reflective layer in the first opening is in contact with the first semiconductor layer.

3. The light-emitting diode according to claim 1, further comprising:
a first pad electrode, electrically connected to the first semiconductor layer, wherein the first electrode layer on the first insulating layer is in electrical contact with the first pad electrode; and
a second electrode, electrically connected to the second semiconductor layer.

4. The light-emitting diode according to claim 1, wherein a reflectivity of the same metal element is greater than 70%.

5. The light-emitting diode according to claim 1, wherein the stress adjustment layer comprises an aluminum alloy.

6. The light-emitting diode according to claim 1, wherein the stress adjustment layer is an aluminum-copper alloy.

7. The light-emitting diode according to claim 1, wherein the first metal reflective layer has a thickness in a range of 100 nanometers (nm) to 500 nm, and the stress adjustment layer has a thickness in a range of 100 nm to 500 nm.

8. The light-emitting diode according to claim 1, wherein the diffusion prevention layer comprises at least one metal selected from the group consisting of titanium, platinum, nickel, copper, chromium, zinc, palladium, rhodium, iridium, ruthenium, and tungsten.

9. The light-emitting diode according to claim 8, wherein the diffusion prevention layer has a thickness in a range of 50 nm to 300 nm.

10. The light-emitting diode according to claim 1, wherein the etch stop layer comprises at least one metal selected from the group consisting of chromium, gold, platinum, tungsten, nickel and titanium.

11. The light-emitting diode according to claim 10, wherein the etch stop layer has a thickness in a range of 5 nm to 2000 nm.

12. The light-emitting diode according to claim 10, wherein the etch stop layer includes a platinum layer having a thickness in a range of 5 nm to 300 nm.

13. The light-emitting diode according to claim 1, wherein the adhesive layer has a thickness in a range of 2 nm to 50 nm, and the adhesive layer comprises at least one metal selected from the group consisting of titanium and chromium.

14. The light-emitting diode according to claim 1, wherein the metal adhesive layer comprises at least one metal selected from the group consisting of chromium, titanium, and nickel.

15. The light-emitting diode according to claim 14, wherein the metal adhesive layer has a thickness in a range of 0.5 nm to 10 nm.

16. A light-emitting diode, comprising:
a light-emitting structure, including a first semiconductor layer, an active layer and a second semiconductor layer stacked sequentially;
a first insulating layer, covering the light-emitting structure and defined with a first opening to expose a portion of the first semiconductor layer; and
a first electrode layer, formed on the first insulating layer and in the first opening, and electrically connected to the first semiconductor layer through the first opening; wherein the first electrode layer includes a first metal reflective layer and a stress adjustment layer, and the first metal reflective layer is located between the first semiconductor layer and the stress adjustment layer;
wherein the first metal reflective layer and the stress adjustment layer contain a same metal element, a content of the same metal element in the first metal reflective layer is greater than that in the stress adjustment layer, and the same metal element is aluminum;
wherein the first electrode layer further comprises an etch stop layer and an adhesive layer, and the etch stop layer is located between the first metal reflective layer and the adhesive layer;
wherein the light-emitting diode further comprises:
a second insulating layer, covering the first electrode layer and being defined with a second opening to expose a portion of the first electrode layer, wherein the adhesive layer is in contact with the second insulating layer;
a first pad electrode, electrically connected to the first semiconductor layer, wherein the first electrode layer on the first insulating layer is in electrical contact with the first pad electrode; and
a second pad electrode, being electrically connected to the second semiconductor layer;
wherein the adhesive layer in the first electrode layer is defined with a through hole at least partially overlapped with the second opening; and
wherein the first pad electrode is in contact with the etch stop layer through the second opening and the through hole.

* * * * *